United States Patent
Wang et al.

(10) Patent No.: US 9,865,836 B2
(45) Date of Patent: Jan. 9, 2018

(54) BROADBAND LIGHT EMITTING DEVICE WITH GRATING-STRUCTURED ELECTRODE

(71) Applicant: Konica Minolta Laboratory U.S.A., Inc., San Mateo, CA (US)

(72) Inventors: Leiming Wang, Foster City, CA (US); Po-Chieh Hung, Cupertino, CA (US)

(73) Assignee: Konica Minolta Laboratory U.S.A., Inc., San Mateo, CA (US)

( * ) Notice: Subject to any disclaimer, the term of this patent is extended or adjusted under 35 U.S.C. 154(b) by 0 days.

(21) Appl. No.: 15/035,701

(22) PCT Filed: Nov. 11, 2014

(86) PCT No.: PCT/US2014/065016
§ 371 (c)(1),
(2) Date: May 10, 2016

(87) PCT Pub. No.: WO2015/070217
PCT Pub. Date: May 14, 2015

(65) Prior Publication Data
US 2016/0285036 A1    Sep. 29, 2016

Related U.S. Application Data

(60) Provisional application No. 61/902,734, filed on Nov. 11, 2013.

(51) Int. Cl.
*H01L 27/32* (2006.01)
*H01L 51/52* (2006.01)
(Continued)

(52) U.S. Cl.
CPC .......... *H01L 51/5225* (2013.01); *H01L 33/38* (2013.01); *H01L 33/505* (2013.01);
(Continued)

(58) Field of Classification Search
CPC ..... H01L 27/30; H01L 27/32; H01L 27/3206; H01L 51/50; H01L 51/5068; H01L 51/5084
See application file for complete search history.

(56) References Cited

U.S. PATENT DOCUMENTS 6,670,772 B1    12/2003  Arnold et al.
8,129,738 B2    3/2012   Barnes et al.
(Continued)

FOREIGN PATENT DOCUMENTS

WO    2012060404 A1    5/2012

OTHER PUBLICATIONS

International Search Report issued in PCT/US2014/065016 dated Feb. 6, 2015 (1 page).
(Continued)

*Primary Examiner* — Hoai V Pham
(74) *Attorney, Agent, or Firm* — Osha Liang LLP

(57) ABSTRACT

A light emitting device includes a substrate layer, a first electrode layer, a light emitting layer, and a patterned second electrode layer. The patterned second electrode layer includes a periodic grating structure having a grating period $\lambda_g$ less than or equal to 200 nm and the patterned second electrode layer and the light emitting layer are separated by at most 100 nm.

16 Claims, 13 Drawing Sheets

(51) Int. Cl.
*H01L 51/50* (2006.01)
*H01L 33/38* (2010.01)
*H01L 33/50* (2010.01)
*H01L 33/40* (2010.01)

(52) U.S. Cl.
CPC ...... *H01L 51/5056* (2013.01); *H01L 51/5072* (2013.01); *H01L 51/5268* (2013.01); *H01L 51/5275* (2013.01); *H01L 33/405* (2013.01); *H01L 2933/0091* (2013.01)

(56) References Cited

U.S. PATENT DOCUMENTS

| 8,390,008 B2 | 3/2013 | Cok |
| 2005/0285127 A1 | 12/2005 | Noto et al. |
| 2009/0153029 A1 | 6/2009 | Khalfin |
| 2012/0229020 A1 | 9/2012 | Yonehara et al. |

OTHER PUBLICATIONS

Written Opinion of the International Searching Authority issued in PCT/US2014/065016 dated Feb. 6, 2015 (5 pages).

Lupton, John M. et al; "Bragg scattering from periodically microstructured light emitting diodes"; Applied Physics Letters; vol. 77, No. 21; Nov. 20, 2000, p. 3340-3342 (3 pages).

Hobson, Peter A. et al; "Surface Plasmon Mediated Emission from Organic Light-Emitting Diodes"; Advanced Materials; vol. 14; No. 19; Oct. 2, 2002, p. 1393-1396 (4 pages).

Notification Concerning Transmittal of International Preliminary Report for Application No. PCT/US2014/065016 dated May 26, 2016 (1 page).

International Preliminary Report on Patentability issued in PCT/US2014/065016 dated May 17, 2016 (6 pages).

1D (Top View)

2D Square Lattice (Top View)

2D Hexagonal Lattice (Top View)

BROADBAND LIGHT EMITTING DEVICE WITH GRATING-STRUCTURED ELECTRODE

BACKGROUND

Energy consumption of lighting systems is presently a major societal concern. This concern has even led to some governments to encourage the development of more energy efficient light sources and smart controls for those light sources. Some methods of improving light efficiency rely on improvements of the underlying materials and structures of the lighting devices themselves. Other methods involve designing customized spectral distributions that satisfy color quality and luminous efficacy. Still other methods require designing light management systems with sophisticated sensors and algorithms to control the intensity of lights depending on ambient light, occupancy, and usage.

For the specific case of multi-layered surface light emitting devices/diodes, including inorganic light emitting diodes (LEDs) and organic light emitting devices (OLEDs), only a small fraction of the generated light often leaves the device. This inefficiency is because much of the generated light becomes trapped in the device, e.g., due to total internal reflection at a layer interfaces as well as at output surface, in addition to absorption of the light by the metal electrode. For example, for a typical OLED comprised of several organic material layers sandwiched by two electrode layers, anode and cathode, only about 20% of the light may be directly emitted into the air. The rest of the light is either trapped inside the substrate (as a substrate mode), inside the organic layers (as a waveguide mode), or absorbed by the metal cathode (usually called a plasmon mode).

Among these many light loss channels, the plasmon loss (may also be termed "plasmonic loss") may amount to about 40% of the total emitted light and thus, the elimination of plasmon loss represents an ongoing challenge in improving the light extraction of (O)LEDs. It is thought that plasmon loss occurs mainly through the coupling of the emitted light into surface plasmon polariton (SPP) waves. SPP waves are surface waves confined to propagating along the interface between the metal electrode layer and the emitting material layer. Energy in the SPP waves is eventually absorbed by the metal electrode and thus leads to inefficient operation of the (O)LED.

Plasmon loss in light emitting devices may be reduced by using a periodic grating-structured electrode having a period that is comparable to the wavelength of the emitted light so as to induce Bragg scattering of the SPP wave into free light. However, existing grating structures are only effective for plasmon loss reduction in a very narrow wavelength range (i.e., monochromatic sources) and none are effective for broadband, i.e., white light, sources such as white OLEDs.

SUMMARY OF INVENTION

In general, in one aspect, the invention relates to a light emitting device that includes a substrate layer, a first electrode layer, a light emitting layer, and a patterned second electrode layer. The patterned second electrode layer includes a periodic grating structure having a grating period $\lambda_g$ less than or equal to 200 nm, and the patterned second electrode layer and the light emitting layer are separated by at most 100 nm.

In general, in another aspect, the invention relates to a light emitting device that includes a substrate layer, a first electrode layer, and a broadband light emitting layer that emits a broadband light having a discrete spectral power distribution of a plurality of emission peaks at a plurality of emission wavelengths. The light emitting device also includes a patterned second electrode layer that includes an optimized periodic grating structure. A plasmonic loss spectrum of the light emitting device due to the patterned second electrode includes a plurality of plasmonic loss peaks at a plurality of wavelengths and the plurality of emission peaks are at different wavelengths from the plurality of wavelengths of the plurality of plasmonic loss peaks.

Other aspects of the invention will be apparent from the following description and the appended claims.

DETAILED DESCRIPTION

Figure 1:
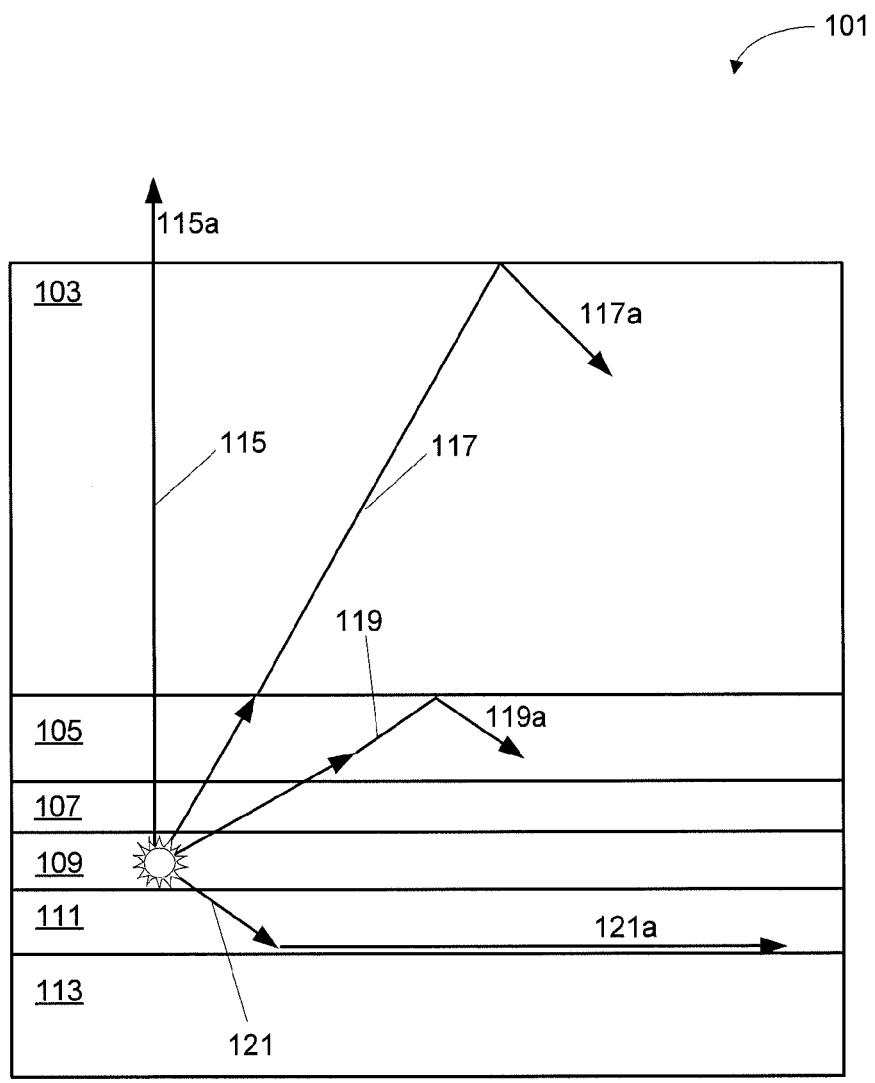
FIG. 1 shows a multi-layered surface light emitting device in accordance with one or more embodiments of the invention.

Specific embodiments of the invention will now be described in detail with reference to the accompanying figures. Like elements in the various figures are denoted by like reference numerals for consistency. Further, the use of "Fig." in the drawings is equivalent to the use of the term "Figure" in the description.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention relate to a light emitting device with a periodic grating structure engineered to impair the formation of surface plasmon polariton waves across the entire range of the visible spectrum (e.g., 430 nm-700 nm). In one or more embodiments of the invention, a multi-layered LED includes a periodic grating structure on a metal electrode layer that inhibits the energy from coupling into the electrode and forming surface plasmons in the metal electrode. In one or more embodiments, the periodic grating structure may be one or two dimensional in nature. The characteristics of the grating structure, such as the size and shape of the grating, are selected to reduce coupling into surface plasmons for a broad wavelength range. In accordance with one or more embodiments of the invention, the multi-layered LED may also include other grating structures to inhibit losses in the LED device at boundaries other than the metal electrode, for example to prevent total internal reflection, formation of waveguide and/or substrate modes.

In one or more embodiments of the invention, the layers of the LED device may be selected based on a plasmonic loss spectrum. For example, the emitting layer wavelength emission may be selected to avoid any wavelengths in a plasmonic loss spectrum. In other words, the size, shape, and material of the layers in the multi-layered LED device may be selected based on the size, shape, and material of one or more grating structures in the LED device.

FIG. 1 shows a cross-section of a light emitting device, e.g., an OLED in accordance with one or more embodiments. The light emitting device 101 is a multi-layered OLED structure having a substrate layer 103, an anode layer 105, a hole transport layer (HTL) 107, an emission layer (EML) 109, an electron transport layer (ETL) 111, and a metal electrode (cathode) layer 113. In accordance with one or more embodiments, the light is emitted from the EML and a portion 115 of the emitted light will be transmitted through the device 101 and will leave the device as emitted light 115a. Other portions of the light may be reflected at the interfaces of the various layers due to the index of refraction mismatch between the various layers, and/or absorbed by the device in the form of various electromagnetic modes. For example, light portion 117 may reflect from the air-substrate interface and may be trapped as a substrate mode 117a. Likewise, light portion 119 may reflect from the anode substrate interface and may be trapped as a waveguide mode 119a. Furthermore, light portion 121 may interact with the metal electrode-ETL interface and may excite surface plasmon modes 121a on the surface of the metal electrode layer 113. In accordance with one or more embodiments of the invention, the surface of the metal electrode layer 113 includes a periodic pattern to reduce the effect of the surface plasmons on the operational efficiency of the device.

One of ordinary skill will appreciate that the layers of the device may be made from a number of different materials. For example, the substrate layer may be made of glass and the anode layer may be made of indium tin oxide (ITO). The hole transport layer may be made of NBP, the emission layer may be made of fluorescent or phosphorescent material, and the electron transport layer may be made of $Alq_3$. Furthermore, one of ordinary skill will appreciate that the metal electrode may be made of any suitable metal, e.g., silver, gold, aluminum, etc. In addition, one of ordinary skill will appreciate that the EML layer may itself be formed of several layers, each having a different band of emission wavelength, e.g., a red emission layer, a green emission layer, and a blue emission layer (not shown). Furthermore, one of ordinary skill will appreciate that the multiple layers in the device may be manufactured by any known OLED manufacturing process. For example, vacuum deposition, solution processes, or lithography techniques.

Figure 2:
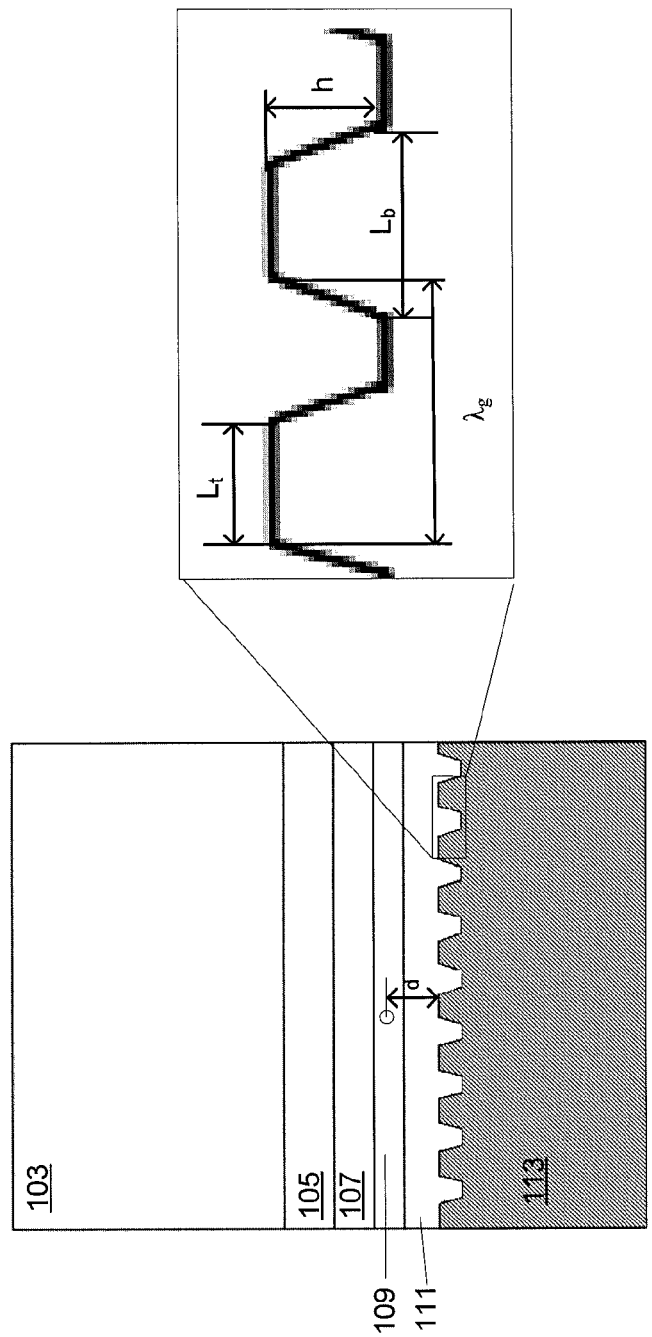
FIG. 2 shows a multi-layered surface light emitting device in accordance with one or more embodiments of the invention.
Figure 11:
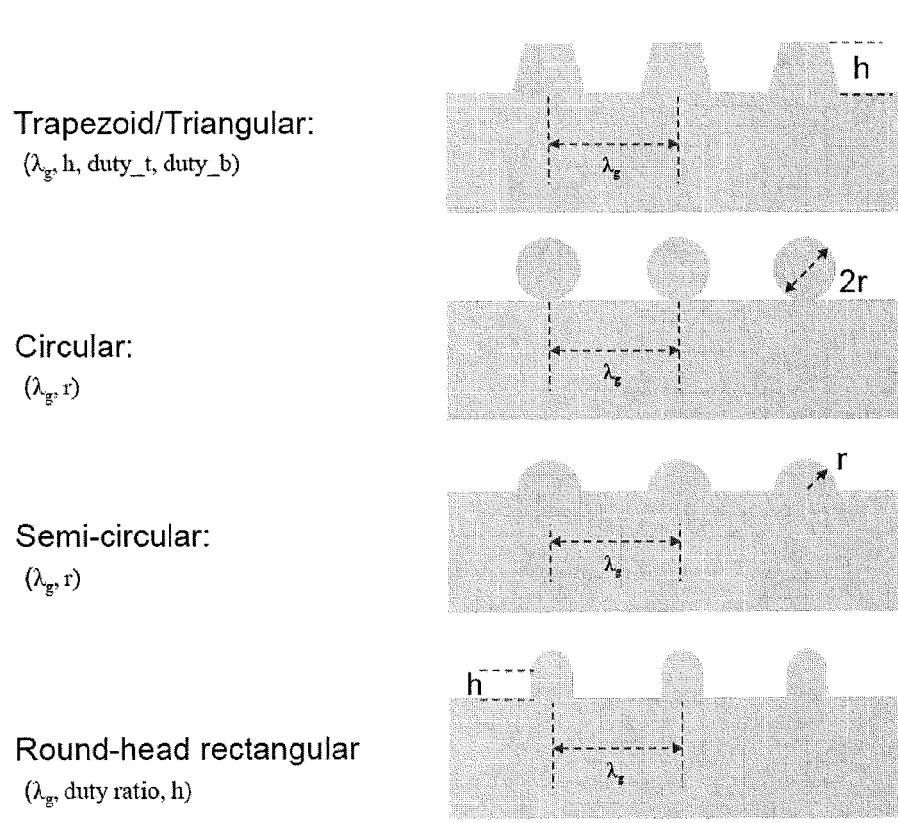
FIG. 11 shows periodic grating structures in accordance with one or more embodiments of the invention.

FIG. 2 shows a cross-section of a light emitting device, e.g., an OLED in accordance with one or more embodiments. In this example, the layers of the device may be the same as those described above in reference to FIG. 1 except for the interface between ETL 111 and a metal electrode (cathode) layer 113. In accordance with one or more embodiments, the metal layer 113 may have a periodic grating structure formed on its surface. In general this surface is formed by a series of protrusions as seen in the inset. While the protrusions are shown as having trapezoidal cross-section in the figure, one of ordinary skill in the art having the benefit of this disclosure will appreciate that the protrusions may take any shape. For example, FIG. 11 shows several examples of protrusions including those having a circular, semi-circular, and round-headed rectangular shapes. Furthermore, the periodic grating structure may take a one or two dimensional form, where the two dimensional form may be arranged in either a square lattice or hexagonal lattice arrangement. Examples, of these different arrangements for the periodic grating structure are shown (in top views) in FIG. 12.

Returning to FIG. 2, the grating structure in accordance with one or more embodiments may be formed from a series of trapezoidal shapes. As shown in the inset, the trapezoidal grating is characterized by the parameters $L_t$, $L_b$, h, and $\lambda_g$, where $L_t$ is the length of the top portion of the trapezoid, $L_b$ is the length of the bottom portions of the trapezoids, h is the depth of the trapezoid, and $\lambda_g$, referred to as the grating period, is the distance between the periodic features, in this case as measured at the top of the trapezoid. The ratio $L_b/\lambda_g$, referred to herein as duty_b and the ratio $L_t/\lambda_g$, referred to herein as duty_t are useful parameters to consider as will be discussed in more detail below. Accordingly, when duty_t=0 the grating structure is triangular. In what follows, the results of numerical simulations are presented for various values of the parameters defined above. Furthermore, in what follows, the variable d is defined, as shown in FIG. 2, to be the distance between the emitter layer and the top surface of the grating-structured electrode layer.

Figure 3:
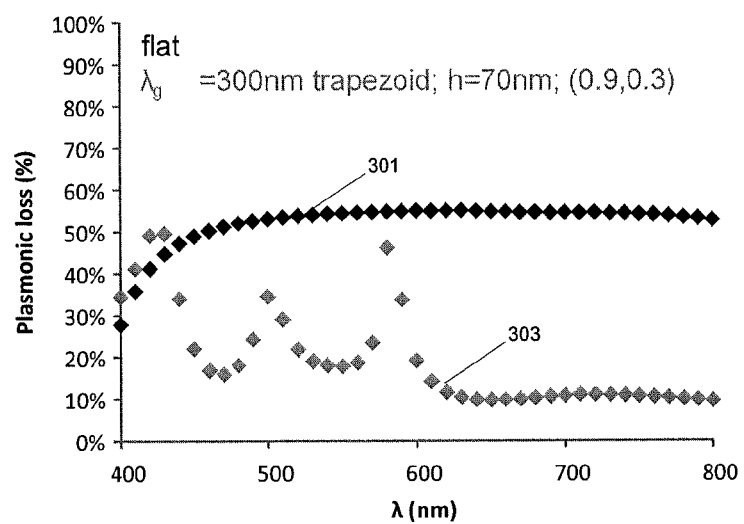
FIG. 3 shows numerically simulated test data in accordance with one or more embodiments of the invention.

FIG. 3 shows an example of numerical simulation, e.g., using the commercial software COMSOL Multiphysics showing the broadband behavior in accordance with one or more embodiments. More specifically, FIG. 3 shows the plasmonic loss ratio, defined as the power dissipated into plasmon mode divided by the total emission power, as a function of wavelength in a two layer system (EML+silver electrode) having a flat electrode structure (dataset 301) and for a periodic grating-structured electrode (dataset 303). In this example, the trapezoidal periodic grating structure is characterized by $\lambda_g$=300 nm, h=70 nm, duty_b=0.9, and duty_t=0.3. The periodic grating-structured electrode shows a strongly wavelength dependent response in the plasmonic loss spectrum having at least three separate resonances at three different wavelengths. In contrast, the flat electrode architecture displays a relatively high plasmonic loss with smooth wavelength dependence. In accordance with one or more embodiments, the precise structure of the grating-structured electrode is optimized to exploit the strong wavelength dependence of the plasmonic loss spectrum thereby achieving a light emitting device having improved broadband plasmonic loss reduction across the visible spectrum.

Figure 4:
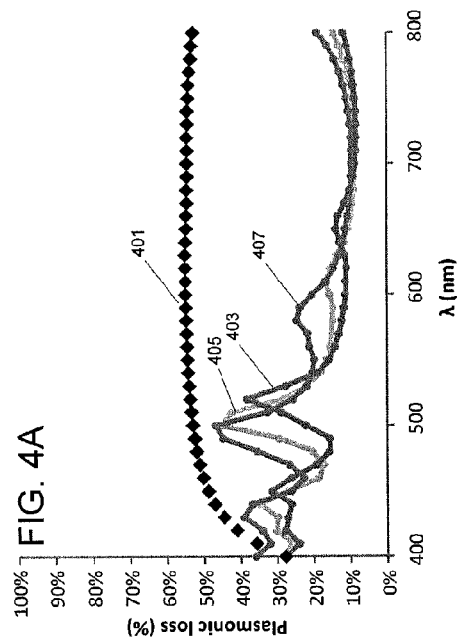
FIGS. 4A-4C show numerically simulated test data in accordance with one or more embodiments of the invention.
Figure 4:
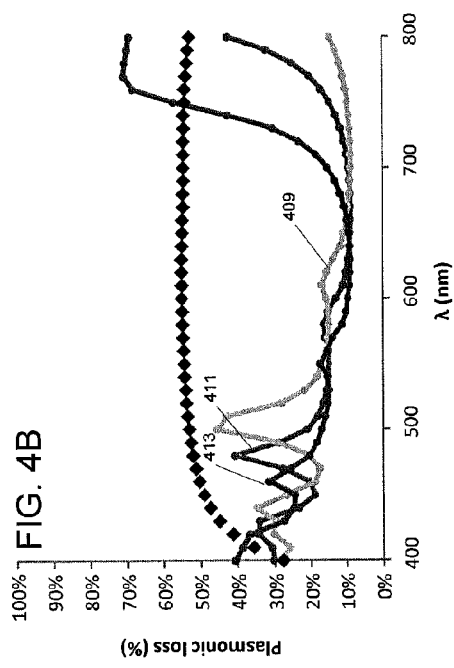
Figure 4:
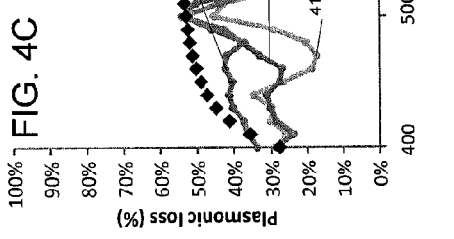

For example, FIGS. 4A-4C show several different numerical results for a number of different geometries of the grating-structured electrode surface. FIGS. 4A-4C show the simulation results of systematically varying the structural shape of a trapezoidal grating having $\lambda_g$=100 nm FIG. 4A the results for simulations comparing a flat electrode surface (dataset 401), with three different trapezoidal geometries. Dataset 403 was obtained using $\lambda_g=100$ nm, h=70 nm, duty_b=0.6, and duty_t=0. Dataset 405 was obtained using $\lambda_g=100$ nm, h=70 nm, duty_b=0.7, and duty_t=0. Dataset 407 was obtained using $\lambda_g=100$ nm, h=70 nm, duty_b=0.8, and duty_t=0. One observation which can be made from the behavior of the simulations is that as duty_b is increased while holding all else fixed, the leftmost resonance beneficially moves further to the blue edge (shorter wavelengths). However, as can be seen in dataset 407, also as duty_b is increased, a new resonance peak appears out of the background. Nevertheless, the simulation shows the unexpected result that using a $\lambda_g$ that is deep-subwavelength is beneficial because the resonance behavior of the plasmonic loss spectrum in such a situation becomes less important in the spectrum of interest. In this case, the numerical simulations are focused in a broadband region of the spectrum that includes the visible spectrum of about 430 nm-700 nm. Thus, as used herein the term deep-subwavelength refers to a length scale that is much smaller than the low end of the visible spectrum.

FIG. 4B shows the results of varying h while keeping the other parameters fixed. Dataset 409 was obtained using $\lambda_g=100$ nm, h=70 nm, duty_b=0.7, and duty_t=0. Dataset 411 was obtained using $\lambda_g=100$ nm, h=60 nm, duty_b=0.7, and duty_t=0. Dataset 413 was obtained using $\lambda_g=100$ nm, h=50 nm, duty_b=0.7, and duty_t=0. Dataset 413 shows a very flat response over a broadband portion of the visible spectrum, indicating that parameters that are close to those shown in the simulation may be used in accordance with one or more embodiments to achieve a broadband light emitting device with improved plasmonic loss characteristics.

FIG. 4C shows the results of varying duty_t while keeping the other parameters fixed. Dataset 415 was obtained using $\lambda_g=100$ nm, h=70 nm, duty_b=0.7, and duty_t=0. Dataset 417 was obtained using $\lambda_g=100$ nm, h=70 nm, duty_b=0.7, and duty_t=0.1. Dataset 419 was obtained using $\lambda_g=100$ nm, h=70 nm, duty_b=0.7, and duty_t=0.2. This simulation further points to dataset 413 as providing nearly optimal results due to the fact that each of these loss spectra exhibit relatively large loss peaks at approximately 500 nm. Furthermore, this study shows that varying duty_t over this range does not appear to dramatically affect the position of the loss peaks at approximately 500 nm.

Figures 5A, 5B:
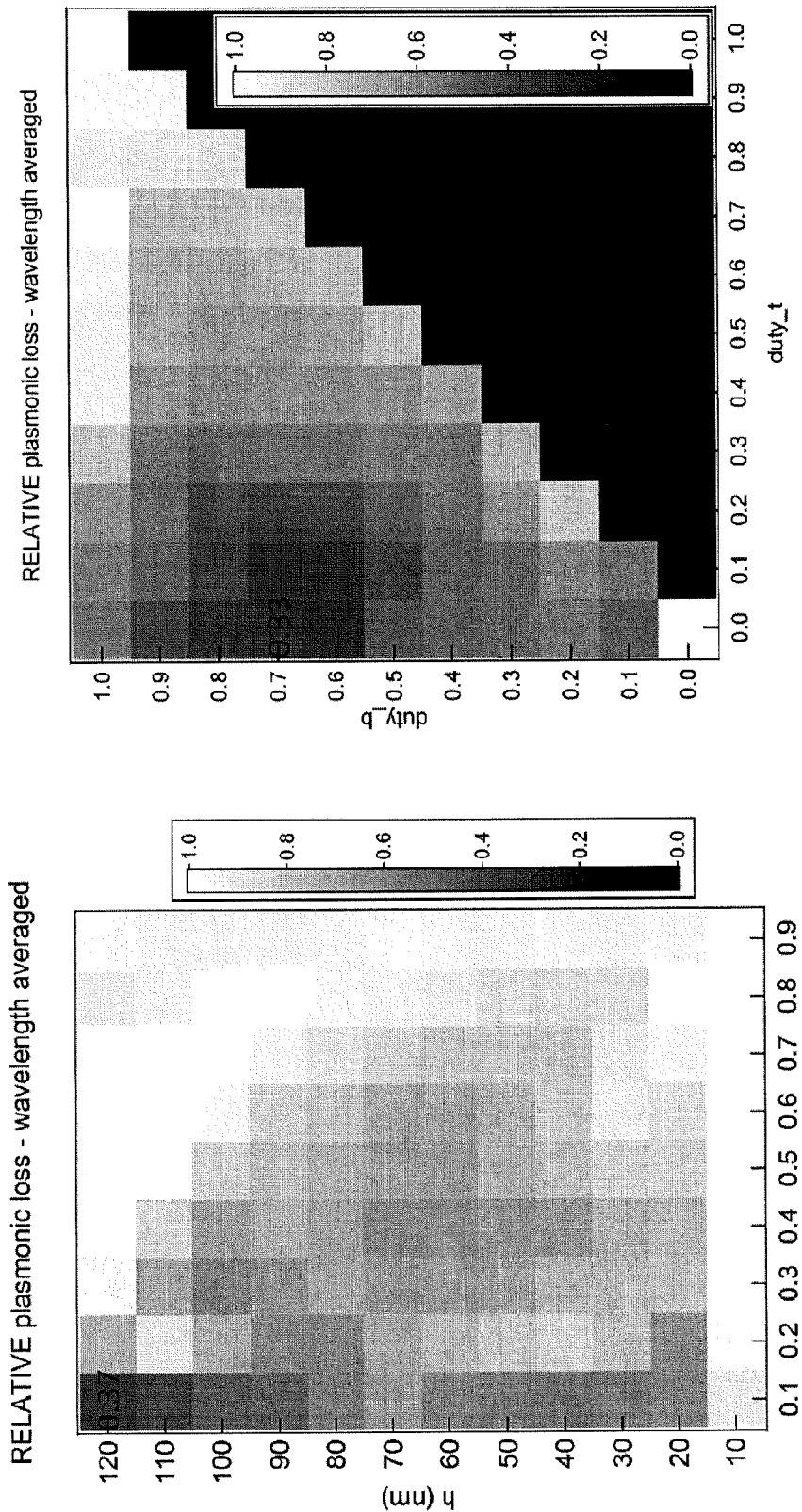
FIGS. 5A-5B show numerically simulated test data in accordance with one or more embodiments of the invention.

FIGS. 5A-5B show further results of numerical simulations for a rectangular grating and a trapezoidal grating, respectively, over a two-dimensional parameter set for $\lambda_g=100$ nm in accordance with one or more embodiments of the invention. The intensity (grayscale) plotted in these figures is the value of the relative plasmonic loss ratio defined as the plasmonic loss ratio of a grating-structured electrode normalized to a flat surface electrode. Darker shading indicates a lower relative plasmonic loss ratio and thus, improved behavior over the flat surface geometry. FIG. 5A shows relative plasmonic loss ratio, averaged over three wavelengths of 475 nm, 535 nm and 625 nm, as a function of both h and duty ratio for a rectangular grating having $\lambda_g=100$ nm [for a rectangular grating, $L_t=L_b=L_{pitch}$, the duty ratio is defined as $L_{pitch}/\lambda_g$]. As can be seen in FIG. 5A, the minimum value of 0.37 for relative plasmonic loss is achieved at h=120 nm and duty ratio of 0.1. FIG. 5B shows relative plasmonic loss ratio, averaged over three wavelengths of 475 nm, 535 nm and 625 nm, as a function of duty_t and duty_b for a trapezoidal architecture having $\lambda_g=100$ nm and h=70 nm. As can be seen in FIG. 5B, the minimum relative loss of 0.33 is achieved at duty_b=0.7 and duty_t=0. Furthermore, FIG. 5B suggests that trapezoidal geometry may exhibit improved plasmonic loss reduction relative to a rectangular architecture.

Figures 6A, 6B:
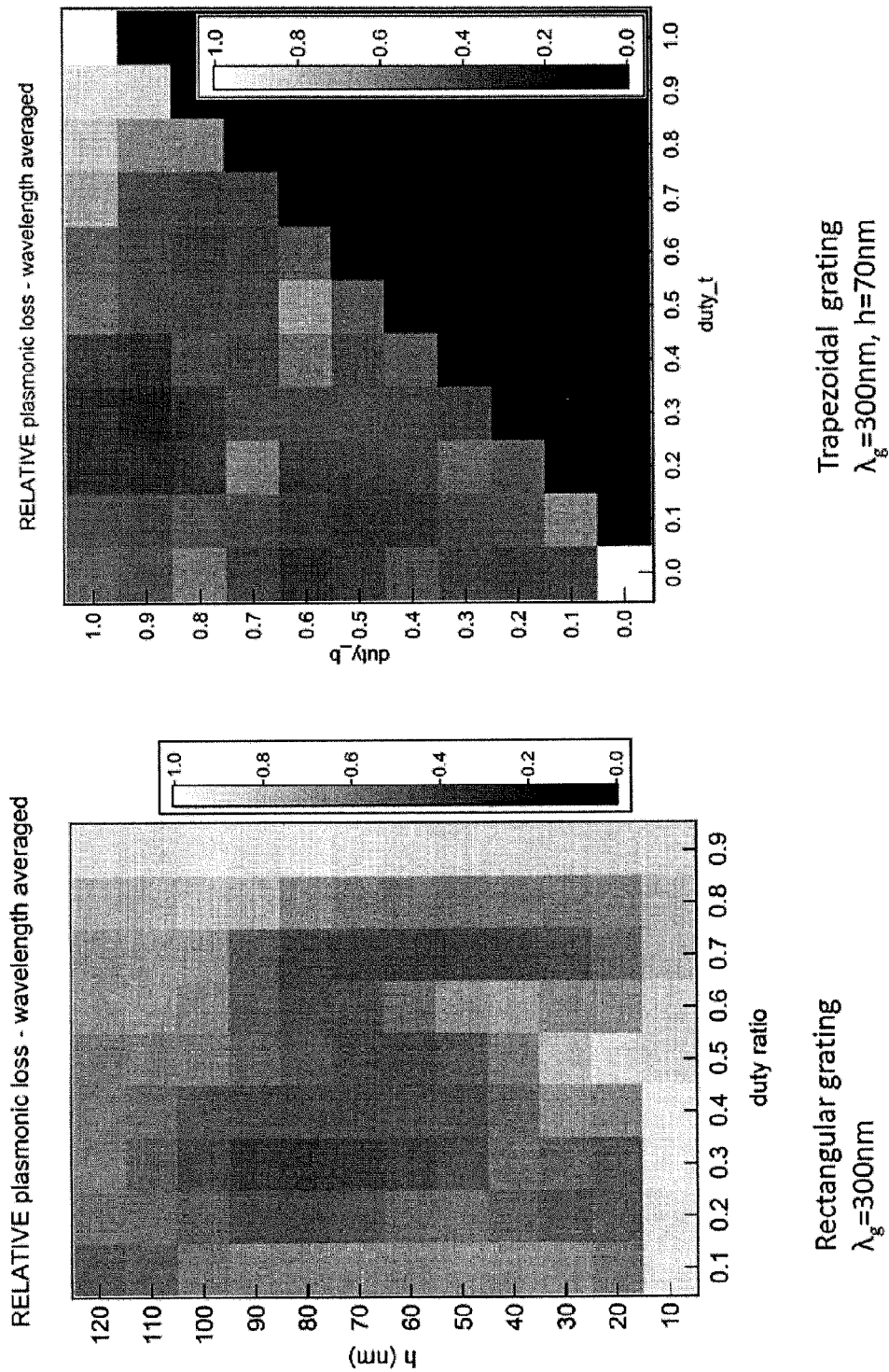
FIGS. 6A-6B show numerically simulated test data in accordance with one or more embodiments of the invention.

FIGS. 6A-6B show further results of numerical simulations for a rectangular grating and a trapezoidal grating, respectively, over a two-dimensional parameter set for $\lambda_g=300$ nm. The intensity (grayscale) plotted in these figures is the value of the relative plasmonic loss ratio defined as the plasmonic loss ratio of a grating-structured electrode normalized to a flat surface electrode. Darker shading indicates a lower relative plasmonic loss ratio and thus, improved behavior over the flat surface geometry. FIG. 6A shows relative plasmonic loss ratio, averaged over three wavelengths of 475 nm, 535 nm and 625 nm, as a function of both h and duty ratio for a rectangular grating having $\lambda_g=300$ nm [for a rectangular grating, $L_t=L_b=L_{pitch}$, the duty ratio is defined as $L_{pitch}/\lambda_g$]. As can be seen in FIG. 6A, the minimum loss of 0.41 is achieved at h=80 nm and duty ratio of 0.3. FIG. 6B shows relative plasmonic loss ratio, averaged over three wavelengths of 475 nm, 535 nm and 625 nm, as a function of duty_t and duty_b for a trapezoidal architecture having $\lambda_g=300$ nm and h=70 nm. As can be seen in FIG. 5B, the minimum loss of 0.31 is achieved at duty_b=0.9 and duty_t=0.3. Again, FIG. 5B suggests that trapezoidal geometry exhibits improved plasmonic loss reduction relative to a rectangular architecture.

Figure 7B:
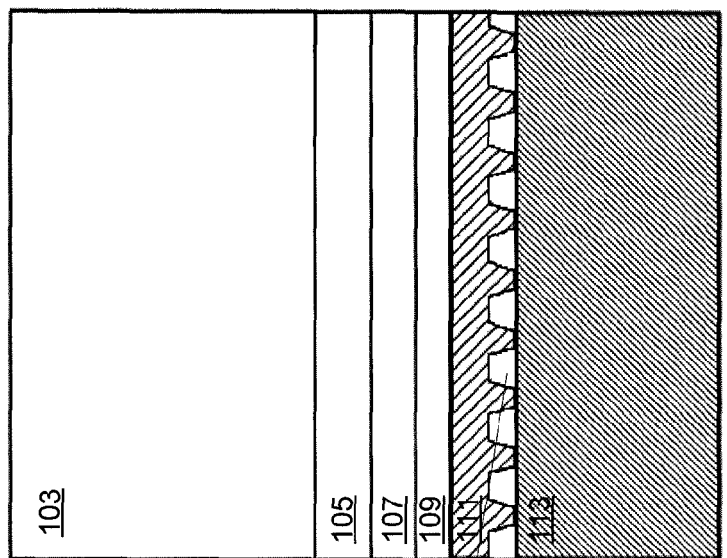
FIGS. 7A-7B show multi-layered surface light emitting devices in accordance with one or more embodiments of the invention.
Figure 7A:
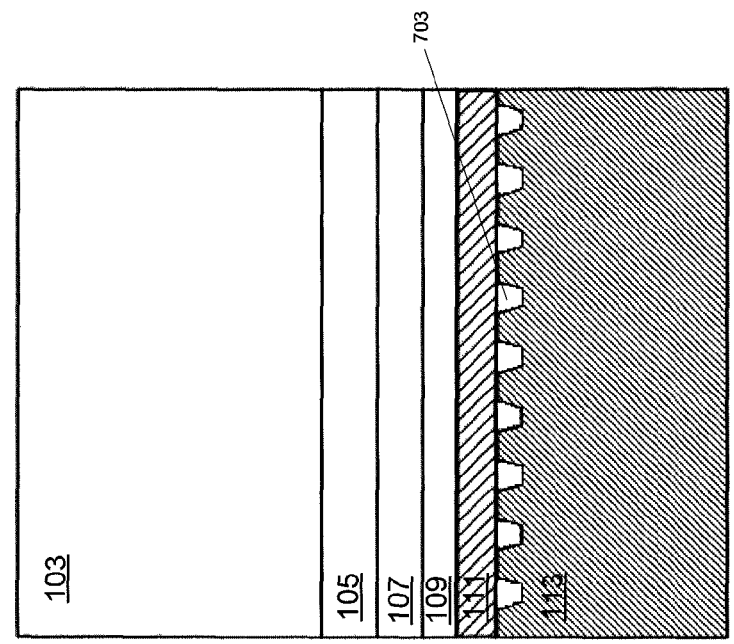

FIGS. 7A-7B show a cross-section of a light emitting device, e.g., an OLED in accordance with one or more embodiments. In particular, FIGS. 7A-7B are identical to the embodiment shown in FIG. 2 except that the ETL layer 111 does not fully mesh with the metal electrode layer 113. For example, in FIG. 7A, the metal electrode layer 113 includes the periodic grating structure while the ETL layer 111 is planar. This type of arrangement results in voids 703 being present in the structure. Likewise, FIG. 7B shows an example where the ETL layer 111 is patterned, but the metal electrode layer 113 is not patterned. This configuration also results in voids 705 being present.

Figure 8:
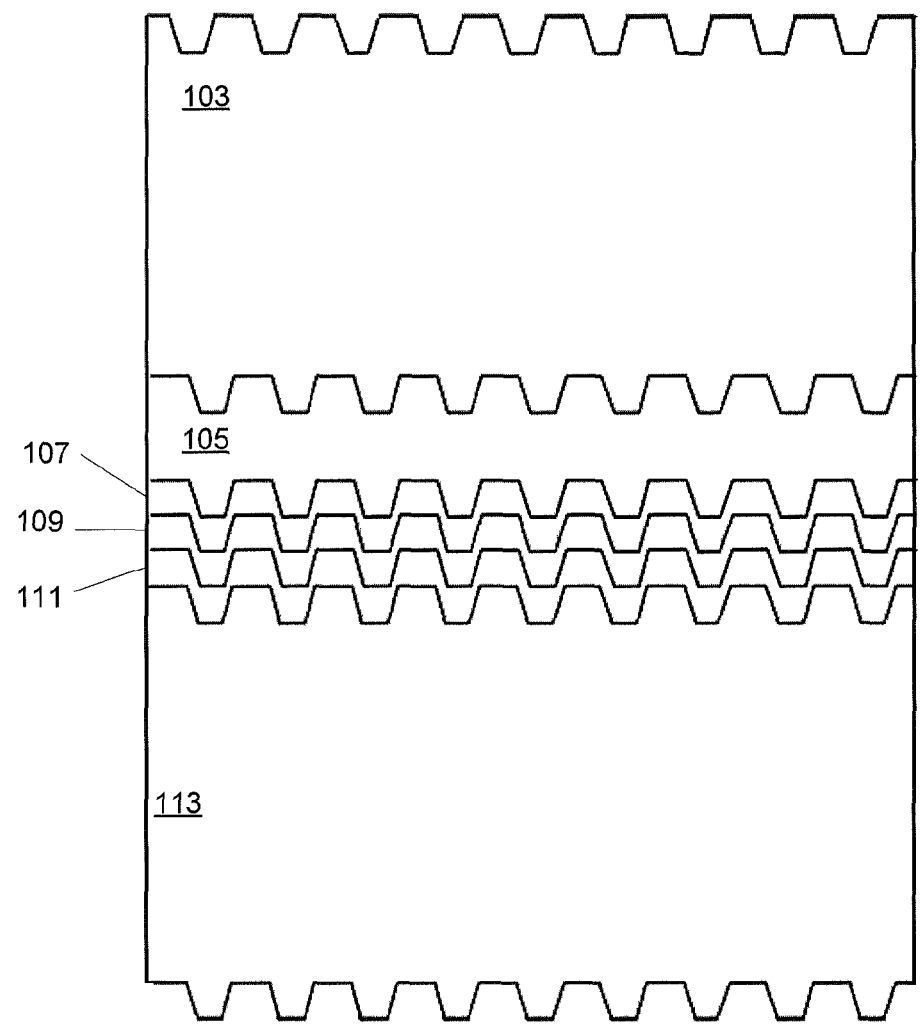
FIG. 8 shows a multi-layered surface light emitting device in accordance with one or more embodiments of the invention.

FIG. 8 shows a cross-section of a light emitting device, e.g., an OLED in accordance with one or more embodiments. In particular, FIG. 8 shows an architecture having the same grating structure carried conformally through all the layers. This arrangement may be advantageous for certain fabrication processes that rely on specific depositions.

Figure 9:
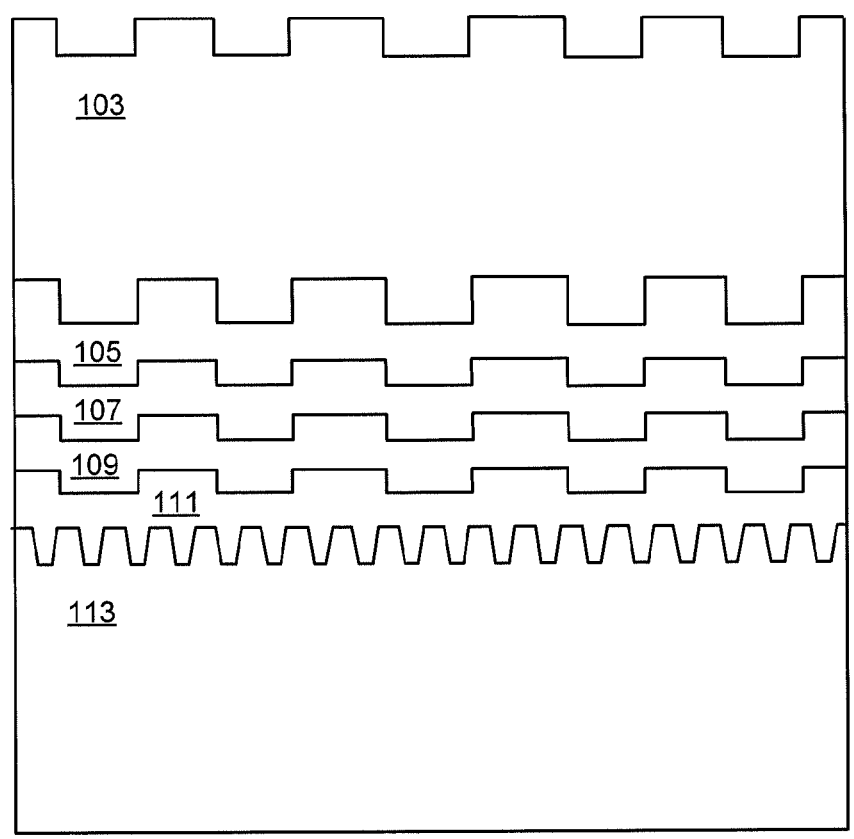
FIG. 9 shows a multi-layered surface light emitting device in accordance with one or more embodiments of the invention.

FIG. 9 shows a cross-section of a light emitting device, e.g., an OLED in accordance with one or more embodiments. In particular, FIG. 9 shows an architecture having a grating-structured metal electrode and also a different grating structure employed throughout the other layers. This type of architecture may be beneficial because the deep-subwavelength grating structure may be employed on the electrode for reducing plasmonic loss as described above and other grating structures may also be applied above the metal layer for other purposes. For example, gratings may be applied at the upper layers for extracting the waveguide and substrate modes in accordance with one or more embodiments.

Figure 10:
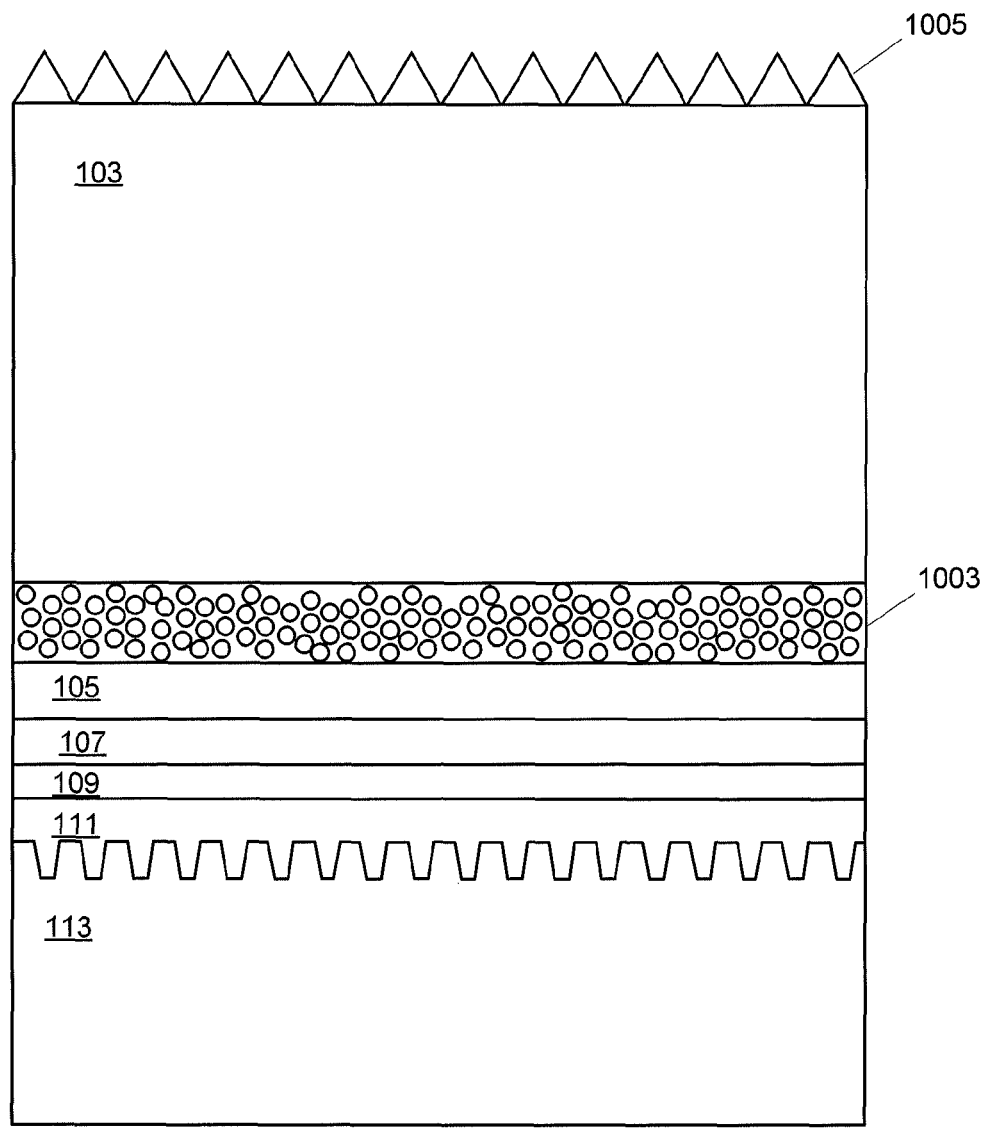
FIG. 10 shows a multi-layered surface light emitting device in accordance with one or more embodiments of the invention.

FIG. 10 shows a cross-section of a light emitting device, e.g., an OLED in accordance with one or more embodiments. In particular, FIG. 10 shows an architecture having a deep-subwavelength grating-structured metal electrode 113 in combination with a high index internal extraction structure (IES) layer 1003 that includes a light scattering particles and also in combination with an upper layer having a microlens array 1005. In accordance with one or more embodiments, the IES layer 1003 and microlens array 1005 may be optimized for outcoupling of the waveguide and substrate modes, respectively.

While the above examples were focused on the optimization of the shape of the grating structure one or more embodiments of the invention may also be implemented by employing a light source design that is optimized per a particular plasmon loss spectrum of a particular grating-structured electrode.

Figure 12:
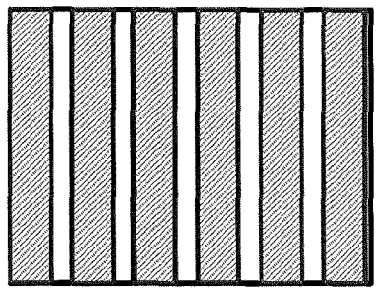
FIG. 12 shows periodic grating structures in accordance with one or more embodiments of the invention.
Figure 12:
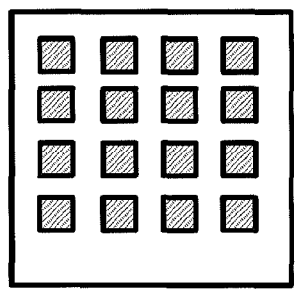
Figure 12:
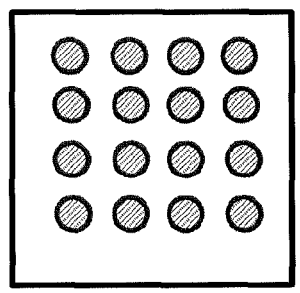
Figure 12:
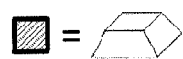
Figure 12:
Figure 12:
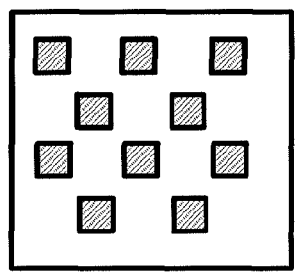
Figure 12:
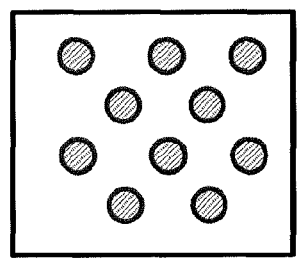
Figure 12:
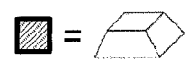
Figure 12:

FIG. 12 shows periodic grating structures in accordance with one or more embodiments of the invention. As shown in FIG. 12, one or more embodiments of the invention may include a 1 dimensional (1D) or 2 dimensional (2D) grating structure. One or more embodiments of the invention may include a 2D square lattice structure or a 2D hexagonal lattice structure. The individual islands that form the 2D structure may include trapezoidal or cone type frustum, as shown in FIG. 12. One or more embodiments of the invention may include a 2D lattice structure similar in shape to the geometries shown in FIG. 11.

Figure 13:
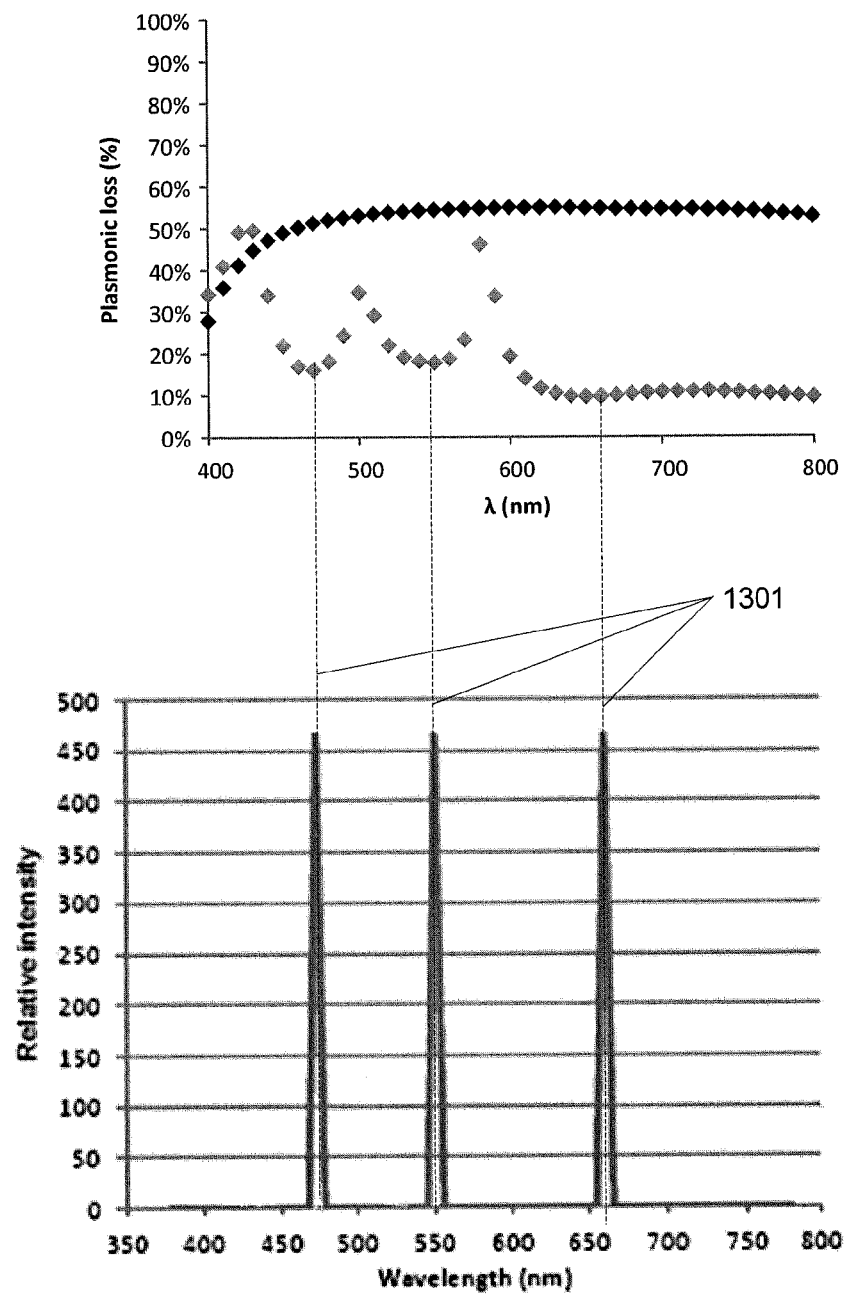
FIG. 13 shows (0)LED light source spectral design in accordance with one or more embodiments of the invention.

FIG. 13 shows an example of a light source emission spectrum design combined with a trapezoid grating-structured electrode having $\lambda_g$=300 nm in accordance with one or more embodiments of the invention. In particular, the spiked spectral power distribution shown in the bottom of FIG. 13 shows wavelength peaks 1301 associated with the source of the light used in the LED. The spiked spectral power distribution may be used in conjunction with an electrode grating that possesses a strong wavelength dependence so long as the source peaks of the spectral power distribution do not overlap significantly with any loss peaks in the plasmonic loss spectrum.

In other words, the wavelength peaks in the source spectral power distribution should not be at the same wavelengths as the peaks in the plasmonic loss spectrum in accordance with one or more embodiments of the invention. Such designer sources may be manufactured according to known methods, for example using quantum dots or optical microcavities, and when used in conjunction with that disclosed herein may operate at increased efficiency when compared to standard broadband (O)LED systems.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A light emitting device comprising:
   a substrate layer;
   a first electrode layer;
   a light emitting layer that emits light in the visible spectrum; and
   a patterned second electrode layer comprising a periodic grating structure having a grating period $\lambda_g$ less than or equal to 200 nm, and
   wherein the patterned second electrode layer and the light emitting layer are separated by at most 100 nm.

2. The light emitting device of claim 1, wherein the periodic grating structure of the patterned second electrode layer comprises a plurality of trapezoidal protrusions.

3. The light emitting device of claim 2, wherein each one of the plurality of trapezoidal protrusions comprises:
   a top portion having a length $L_t$;
   a bottom portion having a length $L_b$; and
   a height h, wherein:
      h is greater than or equal to 30 nm and less than or equal to 70 nm;
      $L_t/\lambda_g$ is greater than or equal to 0 and less than or equal to 0.4; and
      $L_b/\lambda_g$ is greater than 0.5 and less than 1.

4. The light emitting device of claim 3, wherein:
   $\lambda_g$ is less than 120 nm,
   h is greater than or equal to 40 nm and less than or equal to 60 nm,
   $L_t/\lambda_g$ is greater than or equal to 0 and less than or equal to 0.2, and
   $L_b/\lambda_g$ is greater than or equal to 0.6 and less than or equal to 0.8.

5. The light emitting device of claim 1, wherein the grating structure comprises periodicity in two dimensions.

6. The light emitting device of claim 5, wherein the grating structure is arranged in a square lattice structure.

7. The light emitting device of claim 5, wherein the grating structure is arranged in a hexagonal lattice structure.

8. The light emitting device of claim 1, wherein the grating structure comprises periodicity in only one dimension.

9. The light emitting device of claim 1, wherein the periodic structure of the patterned second electrode layer comprises a plurality of conical protrusions.

10. The light emitting device of claim 1, wherein the periodic structure of the patterned second electrode layer comprises a plurality of circular protrusions.

11. The light emitting device of claim 1, wherein the periodic structure of the patterned second electrode layer comprises a plurality of rectangular protrusions.

12. The light emitting device of claim 1, wherein the periodic structure of the patterned second electrode layer comprises a plurality of square protrusions.

13. The light emitting device of claim 1, wherein the light emitting layer comprises a red light emitting layer, a green light emitting layer, and a blue light emitting layer.

14. A light emitting device comprising:
   a substrate layer;
   a first electrode layer;
   a broadband light emitting layer configured to emit broadband light having a discrete spectral power distribution comprising a plurality of emission peaks at a plurality of emission wavelengths;
   a patterned second electrode layer comprising an optimized periodic grating structure,
   wherein a plasmonic loss spectrum of the light emitting device due to the patterned second electrode comprises a plurality of plasmonic loss peaks at a plurality of wavelengths, and
   wherein the plurality of emission peaks are at different wavelengths from the plurality of wavelengths of the plurality of plasmonic loss peaks.

15. The light emitting device of claim 14, wherein the plurality of emission wavelengths are within a range of 430 nm to 700 nm.

16. The light emitting device of claim 14, wherein the plurality of emission wavelengths comprises a red wavelength, a green wavelength, and a blue wavelength.

* * * * *